United States Patent
Vaughan, Jr. et al.

(10) Patent No.: US 7,598,739 B2
(45) Date of Patent: Oct. 6, 2009

(54) RADIO FREQUENCY GRADIENT, SHIM AND PARALLEL IMAGING COIL

(75) Inventors: John Thomas Vaughan, Jr., Stillwater, MN (US); Kamil Ugurbil, Minneapolis, MN (US); Gregor Adriany, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 10/420,541

(22) Filed: Apr. 21, 2003

(65) Prior Publication Data
US 2004/0012391 A1 Jan. 22, 2004

Related U.S. Application Data

(60) Provisional application No. 60/373,808, filed on Apr. 19, 2002, provisional application No. 60/378,111, filed on May 14, 2002.

(51) Int. Cl.
*G01V 3/00* (2006.01)
(52) U.S. Cl. .................................. 324/318; 324/322
(58) Field of Classification Search ................ 324/318, 324/322, 300, 306, 307, 309; 600/421, 422, 600/423
See application file for complete search history.

(56) References Cited

U.S. PATENT DOCUMENTS

| | | | |
|---|---|---|---|
| 4,439,733 A | 3/1984 | Hinshaw et al. ............. 324/322 |
| 4,506,224 A | 3/1985 | Krause | |
| 4,590,427 A | 5/1986 | Fukushima et al. | |
| 4,602,234 A | 7/1986 | Butson | |
| 4,620,155 A | 10/1986 | Edelstein | |
| 4,634,980 A | 1/1987 | Misic et al. | |
| 4,680,548 A | 7/1987 | Edelstein et al. | |
| 4,686,473 A | 8/1987 | Chesneau et al. ........... 324/320 |
| 4,691,163 A | 9/1987 | Blass et al. | |
| 4,692,705 A | 9/1987 | Hayes ........................ 324/318 |
| 4,694,255 A | 9/1987 | Hayes | |
| 4,712,067 A | 12/1987 | Roschmann et al. | |

(Continued)

FOREIGN PATENT DOCUMENTS

EP  0 290 187  11/1988

(Continued)

OTHER PUBLICATIONS

Adriany, Gregor, et al., "Shielded surface coils and halfvolume cavity resonators for imaging and spectroscopy applications at 7 Tesla", *Proc. of the Int'l Soc. for Magnetic Resosnance in Medicine, 8th Scientific Meeting*, vol. 1, (2000), p. 563.

(Continued)

*Primary Examiner*—Louis M Arana
(74) *Attorney, Agent, or Firm*—Crompton, Seager & Tufte LLC

(57) ABSTRACT

A plurality of linear current elements are configured about a specimen to be imaged. A current in each current element is controlled independent of a current in other current elements to select a gradient and to provide radio frequency shimming. Each current element is driven by a separate channel of a transmitter and connected to a separate channel of a multichannel receiver. The impedance, and therefore, the current, in each current element is controlled mechanically or electrically.

30 Claims, 8 Drawing Sheets

U.S. PATENT DOCUMENTS

| | | | |
|---|---|---|---|
| 4,714,887 A | 12/1987 | Meissner et al. | |
| 4,724,389 A | 2/1988 | Hyde et al. | |
| 4,733,190 A | 3/1988 | Dembinski | |
| 4,737,718 A | 4/1988 | Kemner et al. | |
| 4,742,320 A | 5/1988 | Pfizenmaier et al. | |
| 4,746,866 A | 5/1988 | Roschmann | 324/318 |
| 4,751,464 A | 6/1988 | Bridges | |
| 4,792,760 A | 12/1988 | Jacob et al. | |
| 4,799,016 A | 1/1989 | Rezvani | |
| 4,812,761 A | 3/1989 | Vaughan | |
| 4,812,764 A | 3/1989 | Bendall | |
| 4,820,985 A | 4/1989 | Eash | |
| 4,820,987 A | 4/1989 | Mens | 324/318 |
| 4,827,219 A * | 5/1989 | Harrison | 324/322 |
| 4,833,409 A | 5/1989 | Eash | |
| 4,839,594 A | 6/1989 | Misic et al. | 324/318 |
| 4,875,013 A | 10/1989 | Murakami et al. | |
| 4,879,515 A | 11/1989 | Roemer et al. | |
| 4,888,555 A | 12/1989 | Vaughan | |
| 4,916,418 A | 4/1990 | Rath | |
| 4,928,064 A | 5/1990 | Keren | |
| 4,939,465 A | 7/1990 | Biehl et al. | |
| 4,952,878 A | 8/1990 | Mens et al. | |
| 4,992,737 A | 2/1991 | Schnur | 324/318 |
| 5,017,872 A | 5/1991 | Foo et al. | |
| 5,045,792 A | 9/1991 | Mehdizadeh | 324/318 |
| 5,049,821 A | 9/1991 | Duensing et al. | |
| 5,053,711 A | 10/1991 | Hayes | |
| 5,055,853 A | 10/1991 | Garnier | |
| 5,075,624 A | 12/1991 | Bezjak | 324/318 |
| 5,143,688 A * | 9/1992 | Mansfield | 324/318 |
| 5,144,240 A | 9/1992 | Mehdizadeh et al. | 324/318 |
| 5,172,085 A | 12/1992 | Glenat et al. | |
| 5,196,797 A | 3/1993 | Tropp | |
| 5,221,902 A | 6/1993 | Jones et al. | 324/318 |
| 5,260,658 A | 11/1993 | Greim et al. | |
| 5,277,183 A | 1/1994 | Vij | |
| 5,304,932 A | 4/1994 | Carlson | |
| 5,311,160 A | 5/1994 | Higuchi et al. | |
| 5,349,297 A | 9/1994 | DeMeester et al. | |
| 5,370,656 A | 12/1994 | Shevel | |
| 5,381,122 A | 1/1995 | Laskaris et al. | |
| 5,382,904 A | 1/1995 | Pissanetzky | |
| 5,477,146 A * | 12/1995 | Jones | 324/318 |
| 5,510,714 A | 4/1996 | Takahashi et al. | 324/318 |
| 5,514,337 A | 5/1996 | Groger et al. | |
| 5,530,355 A | 6/1996 | Doty | |
| 5,539,315 A | 7/1996 | Cory et al. | |
| 5,543,711 A | 8/1996 | Srinivasan et al. | 324/318 |
| 5,543,713 A | 8/1996 | Arakawa et al. | |
| 5,557,247 A | 9/1996 | Vaughan | 333/219 |
| 5,581,186 A | 12/1996 | Keller | |
| 5,596,276 A | 1/1997 | Nakagawa et al. | |
| 5,619,996 A | 4/1997 | Beresten | 128/653.5 |
| 5,699,801 A | 12/1997 | Atalar et al. | 128/653.2 |
| 5,742,165 A | 4/1998 | Snelten et al. | 324/318 |
| 5,744,957 A | 4/1998 | Vaughan | 324/318 |
| 5,757,189 A | 5/1998 | Molyneaux et al. | |
| 5,841,288 A | 11/1998 | Meaney et al. | 324/639 |
| 5,877,732 A | 3/1999 | Ziarati | 345/8 |
| 5,886,596 A | 3/1999 | Vaughan | 333/219 |
| 5,892,359 A | 4/1999 | Yui et al. | 324/318 |
| 5,898,306 A | 4/1999 | Liu et al. | 324/322 |
| 5,903,198 A | 5/1999 | Weiss | |
| 5,949,311 A | 9/1999 | Weiss et al. | |
| 5,986,455 A | 11/1999 | Magnuson | 324/318 |
| 5,990,681 A | 11/1999 | Richard et al. | 324/318 |
| 5,998,999 A | 12/1999 | Richard et al. | |
| 6,008,649 A | 12/1999 | Boskamp et al. | |
| 6,023,166 A | 2/2000 | Eydelman | |
| 6,029,082 A | 2/2000 | Srinivasan et al. | 600/422 |
| 6,040,697 A | 3/2000 | Misic | 324/318 |
| 6,054,854 A | 4/2000 | Kawamoto | |
| 6,060,882 A | 5/2000 | Doty | |
| 6,060,883 A | 5/2000 | Knuttel | 324/318 |
| 6,133,737 A | 10/2000 | Greim | |
| 6,150,816 A | 11/2000 | Srinivasan | 324/318 |
| 6,177,797 B1 | 1/2001 | Srinivasan | 324/318 |
| 6,201,392 B1 | 3/2001 | Anderson et al. | |
| 6,215,307 B1 | 4/2001 | Sementchenko | |
| 6,232,779 B1 | 5/2001 | Tropp et al. | |
| 6,236,206 B1 | 5/2001 | Hartman et al. | 324/318 |
| 6,323,779 B1 | 11/2001 | Murakami et al. | |
| 6,369,570 B1 | 4/2002 | Wong et al. | 324/318 |
| 6,396,271 B1 | 5/2002 | Burl et al. | |
| 6,420,871 B1 | 7/2002 | Wong et al. | |
| 6,501,274 B1 | 12/2002 | Ledden | 324/318 |
| 6,633,161 B1 | 10/2003 | Vaughan, Jr. | 324/318 |
| 6,788,056 B2 | 9/2004 | Vaughan et al. | |
| 2002/0079996 A1 | 6/2002 | Zhang et al. | |

FOREIGN PATENT DOCUMENTS

| | | |
|---|---|---|
| EP | 0 366 188 | 5/1990 |
| EP | 0414474 | 2/1991 |
| JP | 60-128339 | 7/1985 |
| JP | 04-246332 | 9/1992 |
| JP | 04-364003 | 12/1992 |
| JP | 05-031092 | 2/1993 |
| JP | 08-257011 | 10/1996 |
| JP | 08257011 | 2/1997 |
| WO | WO-98/37438 A1 | 8/1998 |
| WO | WO-99/54759 A1 | 10/1999 |
| WO | WO-00/72033 | 11/2000 |

OTHER PUBLICATIONS

Ballon, D., "A 64 MHz Half-Birdcage Resonator for Clinical Imaging", *J. of Magnetic Resonance,* 90, (1990), pp. 131-140.

Bogdanov, G., et al., "Coupled microstrip line transverse electromagnetic resonator model for high-field magnetic resonance imaging", *Magnetic Resonance in Medicine,* vol. 47, No. 3, (Mar. 2002), 579-93.

Durr, W., et al., "A Dual-Frequency Circularly Polarizing Whole-Body MR Antenna for 69/170 MHz", *Magnetic Resonance in Medicine,* 19 (1991), 446-455.

Gasson, Julia, et al., "Modified Birdcage coils for targeted imaging", *Magnetic Resonance Imaging,* vol. 13, No. 7, (1995), pp. 1003-1012.

Hwang, F., et al., "Automatic probe tuning and matching", *Magnetic Resonance in Medicine,* vol. 39, No. 2, (Feb. 1998), 214-22.

Ledden, Patrick J., et al., "An Four Port Drive Flat-element transmission-Line coil for brain imaging at 3T", *Proc. of the Int'l Soc for Magnetic Resonance*.

Tropp, et al., "The Prospects for Systematic Design of TEM Resonators", *Proceedings of the International Society for Magnetic Resonance in Medicine,* May 22-28, 1999, vol. 1, 1 page.

Ugurbil, K., et al., "The TEM Coil Advantage", *Bioengineering, Inc./HF Imaging, LLC,* 4 pages.

Vaughan, J T., et al., "7T vs. 4T: RF power, homogeneity, and signal-to-noise comparison in head images", *Magnetic Resonance in Medicine,* vol. 46, No. 1, (Jul. 2001),24-30.

Vaughan, J. T., "An improved volume coil for high field MRI", *Int'l Soc for Magnetic Resonance in Medicine, 7th Sci. Mtg,* (May 22, 1999), p. 167.

Vaughan, J. T., et al., "Detunable transverse electromagnetic (TEM) volume coil for high-field NMR", *Magnetic Resonance in Medicine,* vol. 47, No. 5, (May 2002), 990-1000.

Vaughan, J. T., et al., "High Frequency Coils for Clinical Nuclear Magnetic Resonance Imaging and Spectroscopy", *Physica Medica,* 9, (1993), 147-153.

Vaughan, J. T., et al., "High Frequency Volume Coils for Clinical NMR Imaging and Spectroscopy", *Magnetic Resonance in Medicine,* vol. 32, No. 2, (Aug. 1994), 206-218.

Vaughan, J. T., et al., "The Head Cradle: An Open Faced, High Performance TEM Coil", 1 page.

Vaughan, J. T., et al., "Volume coils for highest field MRI", *IEEE Antennas and Propagation Society International Symposium. 2001 Digest. Held in conjunction with: USNC/URSI National Radio Science Meeting, IEEE. Part* vol. 1, (2001), 378-81.

Wen, Han, et al., "The Design and Test of a New Volume Coil for High Field Imaging", *MRM 32* (1994), 492-498.

Zhang, Xiaoliang, "Microstrip RF surface coil design for extremely high-field MRI and spectroscopy", *Magnetic Resonance in Medicine,* vol. 46, No. 5, XP002187186, (Sep. 2001), 443-450.

Dravin, V. A., "Measurements of the Effective Electrodynamical Parameters of the Nb Microstrip Resonator", *International Conference on Materials and Mechanisms of Superconductivity High Temperature Superconductors VI,* vol. 341-348(Part 4), (Feb. 25, 2000),2675-2676.

Gupta, K. C., "Microwave Circuits", *Wiley Encyclopedia of Electrical and Engineering Online,* www.mrw.interscience.wiley.com,(Observed Dec. 27, 1999),33 pgs.

Hetherington, H. P., et al., "Evaluation of Cerebral Gray and White Matter Metabolite Differences by Spectroscopic Imaging at 4.1T", *Magnetic Resonance in Medicince,* 32, (1994),565-571.

How, "Microstrip Antennas", *Wiley Encyclopedia of Electrical and Electronic Engineering Online,* www.mrw.interscience.wiley.com,(Observed Apr. 28, 2000),4 pgs.

Kanal, E., et al., "Safety Considerations in MR Imaging", *Radiology,* 176, (Abstract Only),(1990), 2 pgs.

Kim, S. S., "Miniature Magnetic Resonance Spectrometers", *16th DASC AIAA/IEEE Digital Avionics Systems Conference,* (1997),2.2-14-23.

Ledden, P. J., "Use of a Transmission Line Resonator as a Volume Phased Array", *Proceedings of the International Society for Magnetic Resonance in Medicine, 8th Scientific Meeting,* (Apr. 2000), 1396.

Lee, et al., "Planar Strip Array Antenna for Parallel Spatial Encoded MRI", *Wiley Encyclopedia of Electrical and Electronics Engineering Online,* www.mrw.interscience.wiley.com,(1999).

Ma, Z., "Microstrip Lines", *Wiley Encyclopedia of Electrical and Engineering Online,* 1999, www.mrw.interscience.wiley.com,(Observed Dec. 27, 1999),23 pgs.

Mickelson, A. R., "Active Antennas", *Wiley Encyclopedia of Electrical and Engineering Online,* 1999, www.mrw.interscience.wiley.com,(Observed Dec. 27, 1999),27 pgs.

Price, R. R., et al., "Quality Assurance Methods and Phantoms for Magnetic Resonance Imaging: Report of AAPM Nuclear Magnetic Resonance Task Group No. 1", *Med. Phy.,* 17(2), (1990),287-295.

Sarkar, T. K., "Stripline Components", *Wiley Encyclopedia of Electrical and Engineering Online,* 1999, www.mrw.interscience.wiley.com,(Observed Dec. 27, 1999),10 pgs.

Tsutsumi, M., "Nonlinear Behavior of Electromagnetic Waves in the YIG Film Microstrip Line", *IEEE,* (1998),841-844.

Uğurbil, K., et al., "Imaging at High Magnetic Fields: Initial Experiences at 4 T", *Magnetic Resonance Quarterly,* 9(4), (1993),259-277.

Vaughan, J. T., et al., "A High Frequency Body Coil for Clinical NMR", *Proc. Soc. Magnetic Resonance,* (Abstract),(1994), 1113.

Vaughan, J. T., et al., "RF Front End for a 4.1 Tesla Clinical NMR Spectrometer", *IEEE Transactions on Nuclear Science,* 42(4), (1995), 1333-1337.

Adriany, G., et al., "Shielded Surface Coils and Halfvolume Cavity Resonators for Imaging and Spectroscopy Applications at 7 Tesla", *Proceedings, International Society for Magnetic Resonance in Medicine (ISMRM), 8th Scientific Meeting and Exhibition,* (2000), p. 563.

Alecci, M., et al., "Measurement of Magnetic Coupling Coefficients of TEM Resonators", *Proceedings, International Society for Magnetic Resonance in Medicine (ISMRM), 8th Scientific Meeting and Exhibition,* (2000), p. 566.

Alecci, M., et al., "Practical Design and Testing of Single Element TEM Resonators", *Proceedings, International Society for Magnetic Resonance in Medicine (ISMRM), 8th Scientific Meeting and Exhibition,* (2000), p. 645.

Ballon, D., et al., "A 64 MHz Half-Birdcage Resonator for Clinical Imaging", *Journal of Magnetic Resonance,* 90, (1990), 131-140.

Ledden, P. J., et al., "Use of a Transmission Line Resonator as a Volume rinsed Array.", *Proceedings, International Society for Magnetic Resonance in Medicine (ISMRM), 8th Scientific Meeting and Exhibition,* (2000), p. 1396.

Lee, Ray F., et al., "Planar Strip Array Antenna for Parallel Spatial Encoded MRI", *Proceedings, International Society for Magnetic Resonance in Medicine (ISMRM), 8th Scientific Meeting and Exhibition,* (2000), p. 558.

\* cited by examiner

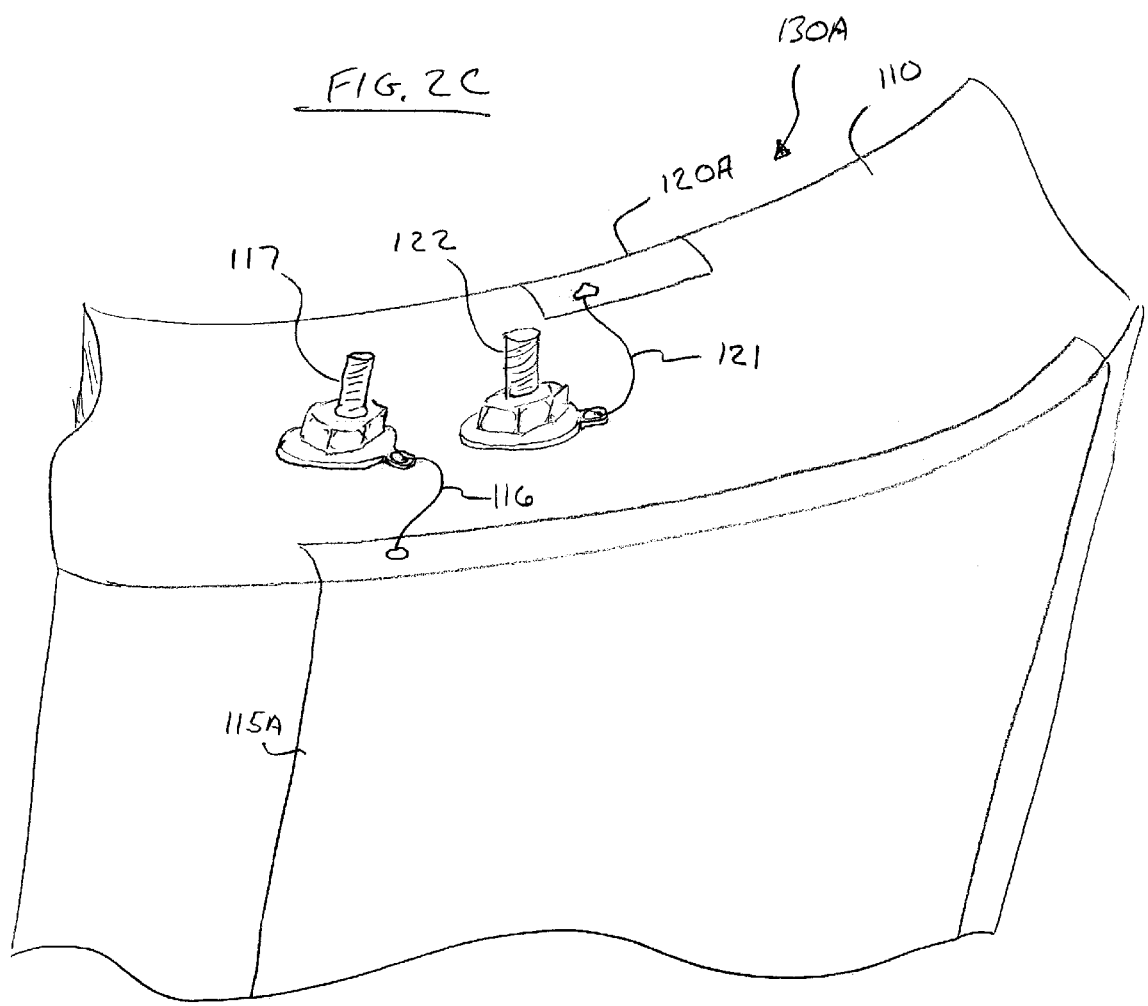

ial Application Ser No. 60/373,808 is hereby incorporated

RADIO FREQUENCY GRADIENT, SHIM AND PARALLEL IMAGING COIL

RELATED APPLICATIONS

This application claims the benefit of U.S. Provisional Application Ser No. 60/373,808, filed, Apr. 19, 2002, and entitled "RF GRADIENT AND SHIM COIL." U.S. Provisional Application Ser No. 60/373,808 is hereby incorporated by reference.

This application claims the benefit of U.S. Provisional Application Ser No. 60/378,111, filed, May 14, 2002, and entitled "SHIM GRADIENT AND PARALLEL IMAGING COIL." U.S. Provisional Application Ser No. 60/378,111 is hereby incorporated by reference.

GOVERNMENT RIGHTS

The present subject matter was partially supported by the National Institute of Health (NIH) under Agency Grant Numbers NIH R01-CA76535 and P41 RR08079. The United States government may have certain rights in the invention.

TECHNICAL FIELD

The present subject matter pertains generally to medical imaging and more specifically to surface and volume coils for magnetic resonance imaging and spectroscopy procedures.

BACKGROUND

In a magnetic resonance imaging system, for example, a radio frequency magnetic field unit, or coil, is positioned in the bore of a magnet. The object to be imaged is placed within the magnetic field unit. The magnetic field unit is driven by an excitation signal that stimulates a nuclear induction (free induction decay) signal in the object, which, in turn, is received by a radio frequency coil. The nuclear induction signal includes information characteristic of the object being imaged. The information in the induction signal can be used to identify chemicals and to diagnose diseases.

Different radio frequency magnetic field units are used to image different portions of a patient depending on such variables as, for example, the patient size and shape and the biomedical region of interest. Thus, for any particular imaging application, the magnetic field unit selected is typically a compromise between performance, size, cost and availability. Consequently, the images resulting from the use of a particular radio frequency magnetic field unit may be inadequate for their intended purpose.

BRIEF DESCRIPTION OF THE DRAWINGS

In the drawings, like numerals describe substantially similar components throughout the several views. Like numerals having different letter suffixes represent different instances of substantially similar components.

FIG. 2C includes a view of connections for electrically connecting a current element of the volume coil to circuitry according o one embodiment.

DETAILED DESCRIPTION

Figure 1:
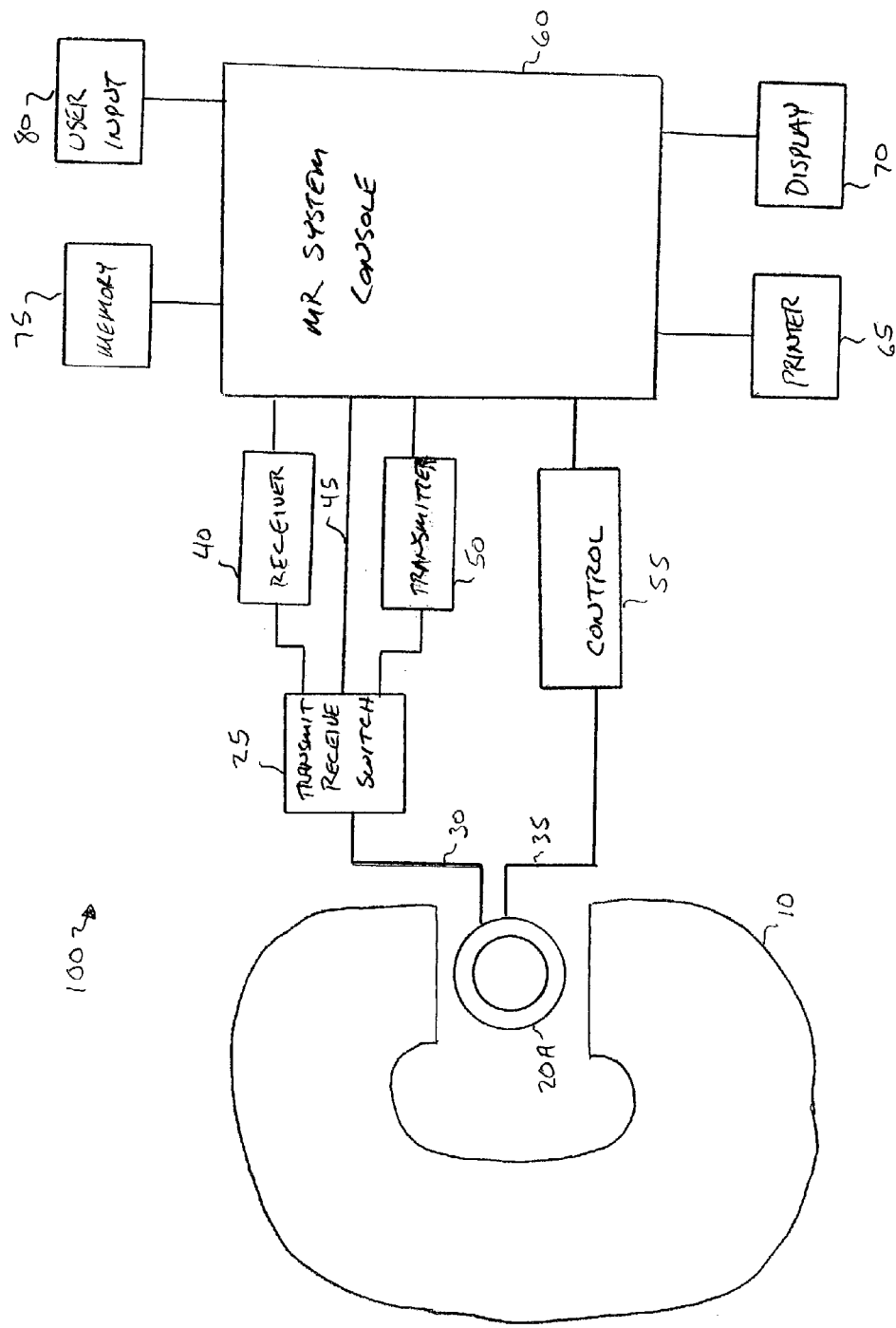
FIG. 1 includes a schematic of a magnetic resonance system according to one embodiment of the present subject matter.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. The following detailed description is, therefore, not to be taken in a limiting sense, and the scope of the present invention is defined by the appended claims and their equivalents. In the drawings, like numerals describe substantially similar components throughout the several views. Like numerals having different letter suffixes represent different instances of substantially similar components.

FIG. 1 includes a schematic of system 100 according to one embodiment. In system 100, magnet 10 provides a static magnetic field for magnetic resonance imaging. Disposed within the magnetic field is coil 20A. Coil 20A provides a radio frequency field for both exciting the region of interest and for detecting signals from the region of interest. Coil 20A is connected to switch 25 and control 55. In one embodiment, control 55 includes an impedance control.

Switch 25, sometimes referred to as a transmit-receive switch, is connected to receiver 40 and transmitter 50, each of which are connected to system console 60. Console 60 is also connected to switch 25 by line 45. Console 60 applies a signal to line 45 to select between a receive mode and a transmit mode for coil 20A. When in transmit mode, as determined by a control signal on line 45, console 60 supplies a radio frequency signal to transmitter 50 and the output of transmitter 50 is delivered to coil 20A. Transmitter 50 provides a radio frequency excitation signal to coil 20A. Console 60, in one embodiment, modulates a signal, or radio frequency current, delivered to coil 20A. In various embodiments, transmitter 50 provides an excitation signal having a modulated amplitude, frequency or phase. The specimen is subjected to a static magnetic field concurrent with both the transmit and receive mode.

Console 60, in one embodiment, includes a processor or controller. Receiver 40, in one embodiment, includes a signal detector. Transmitter 50, in one embodiment, includes a power amplifier. In one embodiment, coil 20A includes a dedicated receiver coil connected to one or more receiver channels. In one embodiment, coil 20A includes a dedicated transmitter coil connected to one or more transmitter channels. In one embodiment, two or more coils 20A are used with at least one coil dedicated for transmitting and at least one coil dedicated for receiving.

In one embodiment, transmitter 50 includes a single transmitter having multiple output channels, each of which is selectively operable. For example, in one embodiment, transmitter 50 provides a quadrature signal to coil 20A via multiple independent channels. In one embodiment, transmitter 50 of the figure represents multiple transmitters, each connected to a separate current element of coil 20A.

Following excitation, console 60 transitions to a receive mode. When in receive mode, console 60 provides a signal on line 45 to instruct switch 25 to connect coil 20A with an input of receiver 40. Receiver 40 supplies an electrical signal to console 60 based on the received signal generated by coil 20A. Coil 20A generates an electrical signal based on a received signal which is generated by the specimen.

In one embodiment, receiver 40 includes multiple receive channels, each of which is selectively operable. For example, in one embodiment, receiver 40 receives multiple signals from coil 20A via multiple independent channels. In one embodiment, receiver 40 of the figure represents multiple receivers, each connected to a separate current element of coil 20A.

The current flowing in coil 20A, in various embodiments, is modulated by console 60, transmitter 50 or switch 25. The radio frequency current flowing in coil 20A, in one embodiment, is circularly polarized. Circular polarization entails sequentially driving individual segments of the coil in a manner that creates a circularly polarized field within the coil. Circular polarization is also referred to as quadrature drive. In various embodiments, the phase, frequency or amplitude of the radio frequency current is modulated.

Control 55 is connected to coil 20A and console 60. Console 60 supplies a signal to control 55 to select a value of a parameter of a particular current element or group of current elements. In one embodiment, the parameter includes impedance. For example, in one embodiment, a program executing on console 60 determines the impedance of one or more current elements of coil 20A. In various embodiments, the impedance of a current element is adjusted by changing a dielectric constant between conductors of the current element, by changing an inductance, by changing capacitance or by changing a resistance. In one embodiment, control 55 provides a direct current control signal to an adjustable component of coil 20A.

In one embodiment, at least one phase shifter is connected to at least one current element of the coil. A phase shifter allows control of the phase of a signal propagating on the coil. Phase shifters, in various embodiments, include delay lines, PIN diodes or reactive components that allow selective control of a phase.

In one embodiment, the coil of the present subject matter is tuned to a particular resonant frequency by adjusting a PIN diode or other devices. In one embodiment, the coil of the present subject matter is detuned from a particular resonant frequency by adjusting a PIN diode or other devices.

In one embodiment, the coil of the present subject matter is tuned to multiple resonant frequencies.

Console 60 is connected to memory 75, user input 80, printer 65 and display 70. Memory 75 provides storage for data and programming accessible to console 60. Memory 75, in various embodiments, includes random access memory, read only memory, removable storage media, optical media, magnetic media or other digital or analog data storage. User input 80 includes a user accessible input device, including, for example, a keyboard, a mouse or other pointing device, an optical device, touch sensitive screen or microphone. Printer 65 includes hardware for producing a printed output, or paper copy, and in various embodiments, includes a laser printer, dot matrix printer or an ink jet printer. Display 70 includes hardware for generating a visible image based on data from console 60, and in one embodiment, includes a liquid crystal display, cathode ray tube display or other computer monitor. Other functions and features may be present in a magnetic resonance imaging console.

Figure 2A:
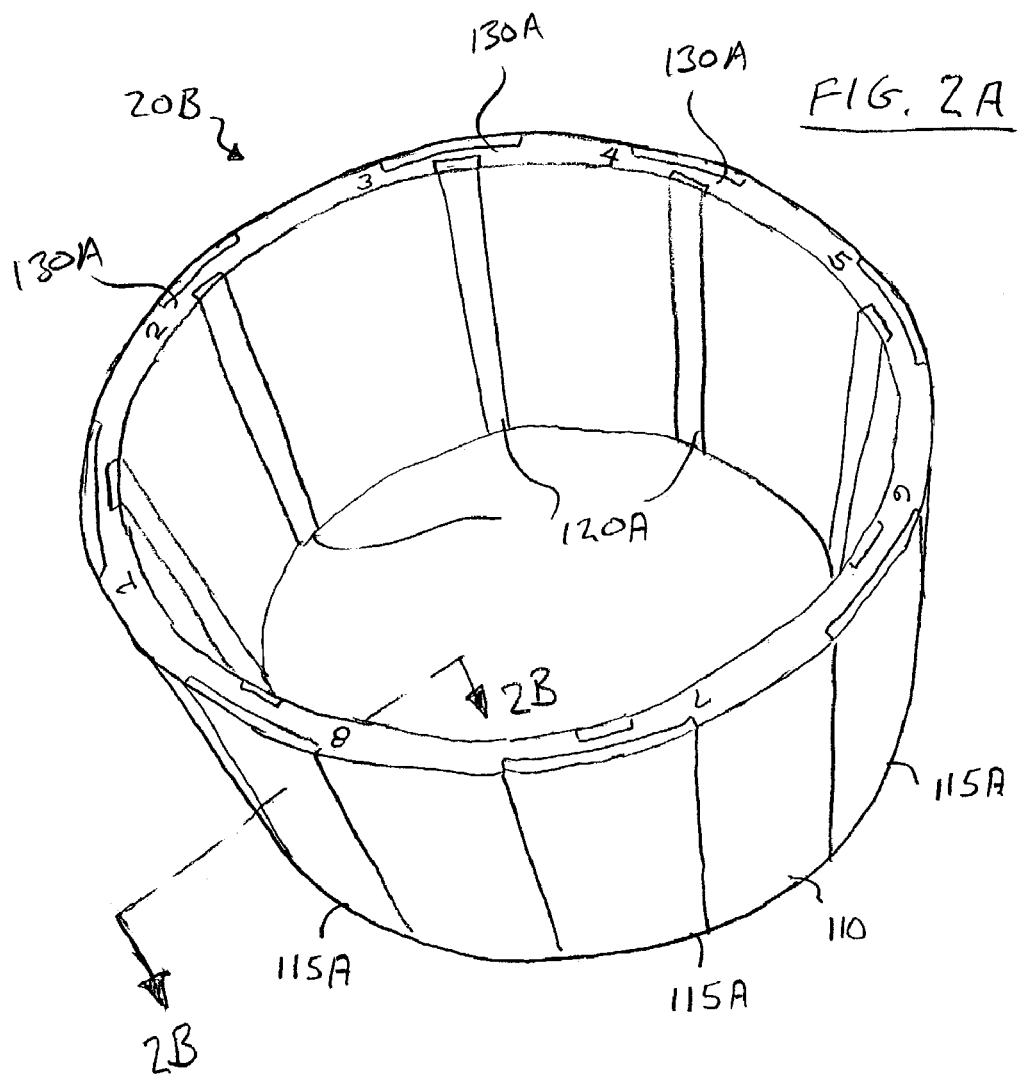
FIG. 2A includes a perspective view of a volume coil according to one embodiment of the present subject matter.

FIG. 2A includes a perspective view of coil 20B according to one embodiment of the present subject matter. Coil 20B, as shown in the figure, includes eight current elements arranged in the shape of a cylindrical wall. Each current element includes a pair of linear conductors separated by a dielectric. The dielectric, in one embodiment, is disposed along at least a portion of the length of the linear conductors. The conductors arranged substantially in parallel with each other and substantially in parallel with a central axis of the volume enclosed by the cylindrical wall. Dielectric 110 is disposed between an inner conductor 120A and an outer conductor 115A. In the embodiment shown, each current element includes an inner conductor 120A and an outer conductor 115A, each in the form of a conductive strip, and inlaid on dielectric 110. A view of current element 130A is illustrated in section view FIG. 2B. In one embodiment, inner conductor 120A and outer conductor 115A of a current element are mounted on a surface of dielectric 110.

Figure 2B:
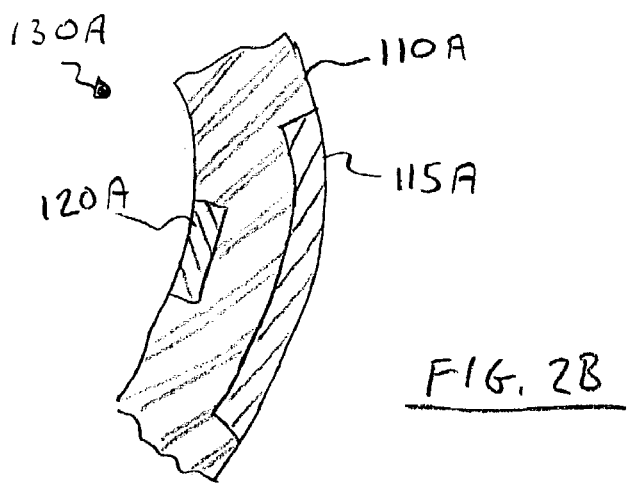
FIG. 2B includes a section view along cut line 2B-2B of FIG. 2A.

For each current element 130A, as shown in FIG. 2B, inner conductor 120A is aligned with outer conductor 115A. In one embodiment, inner conductor 120A includes a conductor having a circular cross section as, for example, a wire, rod or tube. In the embodiment illustrated, both inner conductor 120A and outer conductor 115A are foil strips. In one embodiment, outer conductor 115A includes a screen, mesh or perforated conductive material.

Inner conductor 120A and outer conductor 115A, in one embodiment, are fabricated of copper. Other conductive materials are also contemplated, including, for example, aluminum or semiconductor materials. In one embodiment, inner conductor 120A and outer conductor 115A include thin conductive plating applied by semiconductor fabrication methods, including for example, electroplating, vapor deposition, or etching or by adhesive bonding.

Each current element 130A of coil 20B is sufficiently spaced apart from an adjacent current element to be electrically reactively decoupled. In one embodiment, each current element 130A is sufficiently close that adjacent current elements are reactively coupled.

Dielectric 110, in one embodiment, includes polytetrafluoroethylene (PTFE) or Teflon® or other non-conductive material. In the embodiment illustrated, dielectric 110 is a continuous section of tubular material, however, discrete segments may also be held in alignment to create a volume coil.

In one embodiment, the dielectric includes air, liquid or other fluid.

Coil 20B of FIG. 2A is suited for use as a volume coil, such as, for example, a head coil or body coil. Coil 20B of FIG. 2A can be used as a transmit coil, a receive coil or both and in one embodiment, the coil is used for parallel imaging.

FIG. 2C illustrates one embodiment of electrical contacts or connections for connecting current element 130A of coil 20A with the structure and circuitry of FIG. 1. In the figure, outer conductor 115A is connected to terminal 117 by link 116 and inner conductor 120A is connected to terminal 122 by link 121. Terminals 117 and 122, in one embodiment, each include a binding post or other threaded fastener. Links 116 and 121, in one embodiment, each include a segment of electrical wire. The wire is soldered to a lug affixed to a terminal and either an inner conductor or outer conductor.

In one embodiment, links 116 and 121 include conductive traces on an insulator. Other contacts or electrical connections are also contemplated, such as, for example, a cable electrically connected to the coil and fitted with an electrical connector. In one embodiment, an electrical connection includes a soldered connection. In one embodiment, a component (such as a capacitor, PIN diode or both) is soldered between inner conductor 120A and outer conductor 115A. Radio frequency signal and direct current (DC) control leads are also soldered across the gap between inner conductor 120A and outer conductor 115A. The radio frequency leads are attached to a TR switch, preamplifier, power amplifier or some combination thereof. The DC leads, in one embodiment, are attached to a PIN diode driver or voltage bias source. The connection point, in one embodiment, is positioned across a gap disposed anywhere on the current element.

Figure 3A:
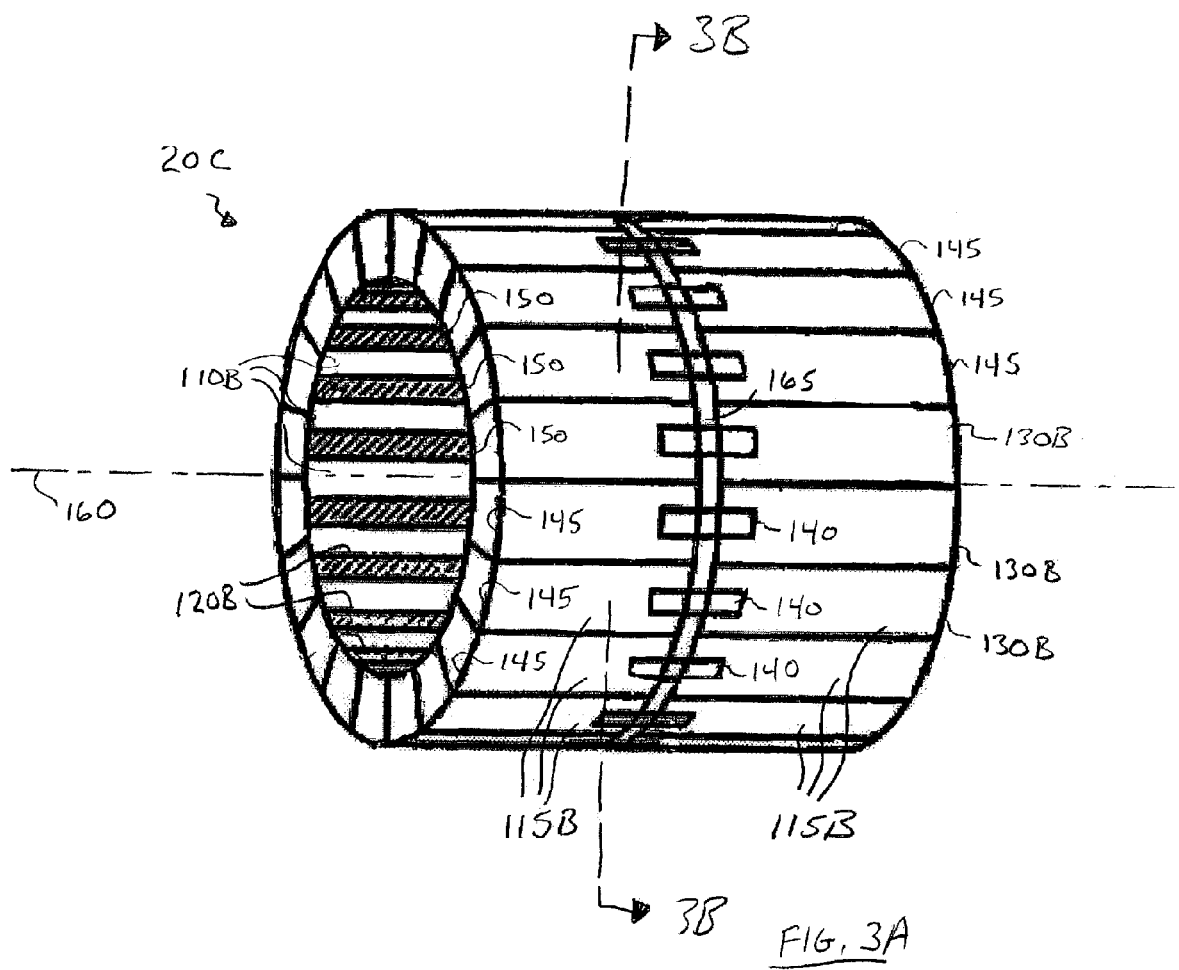
FIG. 3A includes a view of a volume coil according to one embodiment of the present subject matter.

FIG. 3A illustrates coil 20C according to the present subject matter. In the figure, coil 20C includes twenty current elements 130B arranged about a volume. More or less than twenty current elements are contemplated for other embodiments. Each current element 130B is sufficiently close to an adjacent element 130B to be reactively coupled. Each current element 130B includes an outer conductor 115B and in inner conductor 120B arranged in parallel alignment, with each aligned on axis 160 through the center of the volume. Dielectric 110B is disposed between each current element 130B.

In the embodiment shown, each current element 130B includes outer conductor 115B. The segments are electrically connected together at connector 140. Connector 140, in one embodiment, also provides an electrical connection to coil 20C. Other electrical connections to coil 20C are provided at connector 130B at one end and at connector 150 at a second end. In one embodiment, a discontinuity is provided at a point along the length of the current element, such as, for example, gap 165 disposed near the midpoint. Gap 165, in various embodiment, provides improved current distribution for the current element or improved shielding of contact points for the inside sample volume. An electrical connection, in various embodiments, includes a binding post, a soldered joint, or other electrical connector. In one embodiment, the outer conductor is split into more than two segments. In one embodiment, some current elements have multiple segment outer conductors and other current elements have a single segment outer conductor.

In one embodiment, at least one inner conductor 120B is segmented or split. At the gaps between segments or splits, a contact point may be provided for connecting components. Examples of components include capacitors, inductors, PIN diodes, voractors, radio frequency cable attachment points, DC control lines or other components.

Figure 3B:
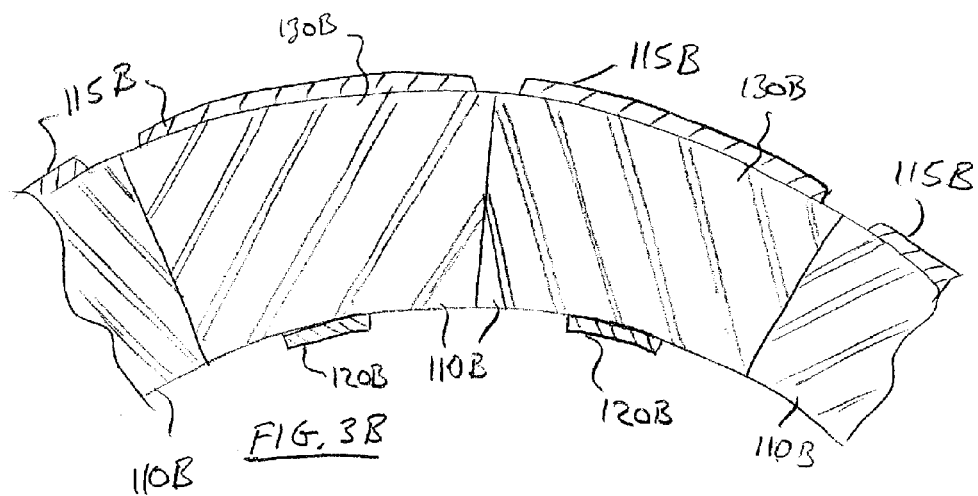
FIG. 3B includes a section view along cut line 3B-3B of FIG. 3A.

FIG. 3B includes a section view along cut line 3B-3B of the embodiment in FIG. 3A. In the figure, outer conductors 115B are set atop a surface of dielectric 110B and inner conductors 120B are set below a surface of dielectric 110B. The figure illustrates a segmented dielectric with two segments shown as well as two portions of segments. Adjacent dielectric segments, in one embodiment, are joined together by an adhesive, mechanical fastener or by other fastening means. Adjacent dielectric segments, in one embodiment, are continuous. Adjacent outer conductor segments 115B are separated by a space, or slot.

Figure 3C:
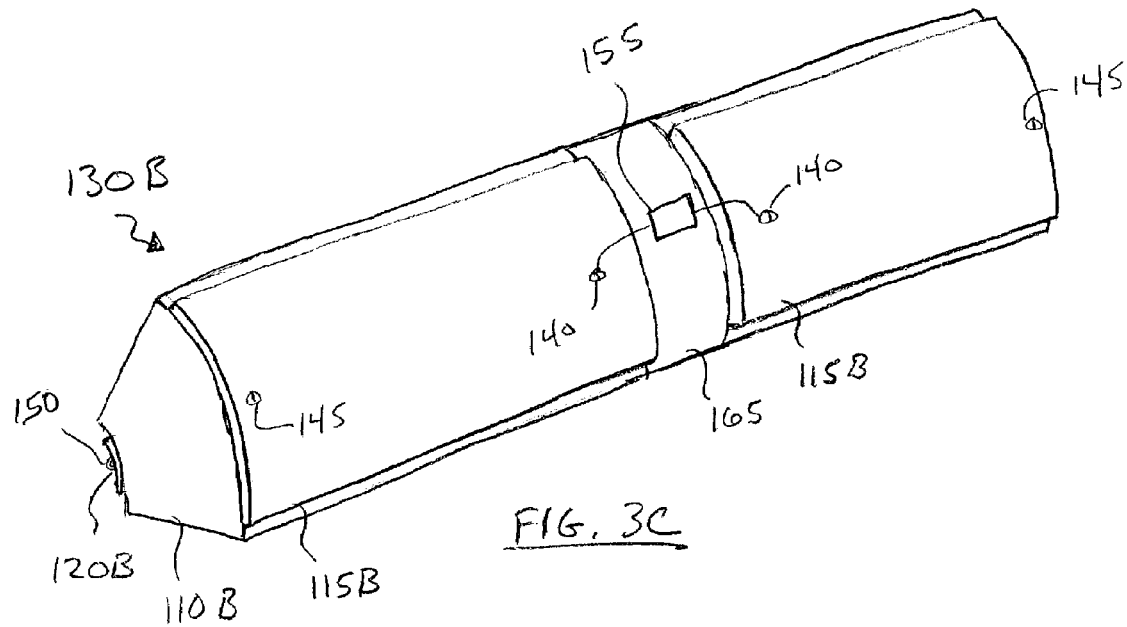
FIG. 3C includes a view of a current element according to one embodiment of the present subject matter.

FIG. 3C illustrates current element 130B according to one embodiment, such as that shown in FIGS. 3A and 3B. The figure illustrates two segments, or sections, of outer conductor 115B separated by gap 165. Each segment of outer conductors 115B is connected by electrical component 155. In one embodiment, component 155 includes a reactive component, such as, for example, an electrical capacitor. In one embodiment, component 155 includes an electrical wire, an inductor, a resistor, or other combination of passive or active electrical components. In one embodiment, electrical component 155 is adjustable such that an electrical parameter or quality can be selectively varied. Electrical component 155 is connected to outer conductor 115B at connectors 140. Connector 140, in one embodiment, includes a solder point. In one embodiment, current element 130B includes connection points disposed on either side of a gap in the current element between outer conductor 115B and inner conductor 120B. In one embodiment, current element 130B includes connection points disposed at a strategically selected point on the current element. In one embodiment, current element 130B includes connectors 145 disposed at ends of outer conductor 115B. A portion of inner conductor 120B is illustrated and includes a connector 150.

In one embodiment, one or more radio frequency signals are provided to coil 20B or received from coil 20B. In one embodiment, one or more control signals are provided to coil 20B or received from coil 20B. The radio frequency signals or control signals are electrically connected to coil 20B across gaps positioned at 140, 145 or 150 or at other positions selected on a current element.

Electrical component 155, in various embodiments, includes a PIN diode, a transistor, a voractor, a phase shifter or other active electrical component. Electrical component 155, in various embodiments, includes a capacitor, an inductor, a filter, a TR switch, a preamplifier circuit or a power amplifier feed point. In one embodiment, electrical component 155 includes circuitry to adjust the electrical coupling between the segments of outer conductor 115. For example, in one embodiment, electrical component 155 includes a voltage biasing circuit to adjust a PIN diode connected between the segments. As another example, in one embodiment, electrical component 155 includes a circuit to adjust modulation of a transistor connected between the segments. In one embodiment, component 155 includes a voractor or silicon controlled rectifier.

Figure 4:
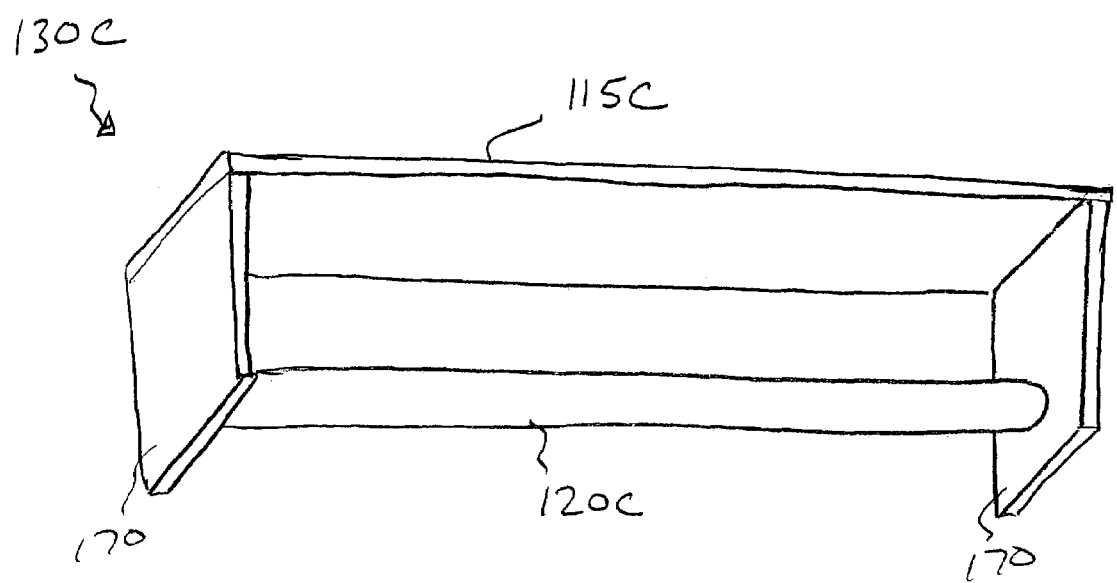
FIG. 4 includes a view of a current element according to one embodiment of the present subject matter.

FIG. 4 illustrates current element 130C according to one embodiment of the present subject matter. In the figure, current element 130C includes outer conductor 115C and inner conductor 120C separated by an air dielectric. In the figure, outer conductor 115C includes a thin copper foil connected to insulator copper foil end plates 170. Inner conductor 120C includes a metallic rod or shaft or copper foil strip.

The present subject matter can be used for active shimming of radio frequency fields or for selecting a slice plane or volume in a specimen under observation. The present subject matter can be operated under control of console 60 or operated manually or operated by other controlling circuitry. The following describes methods of using the present subject matter.

Figure 5:
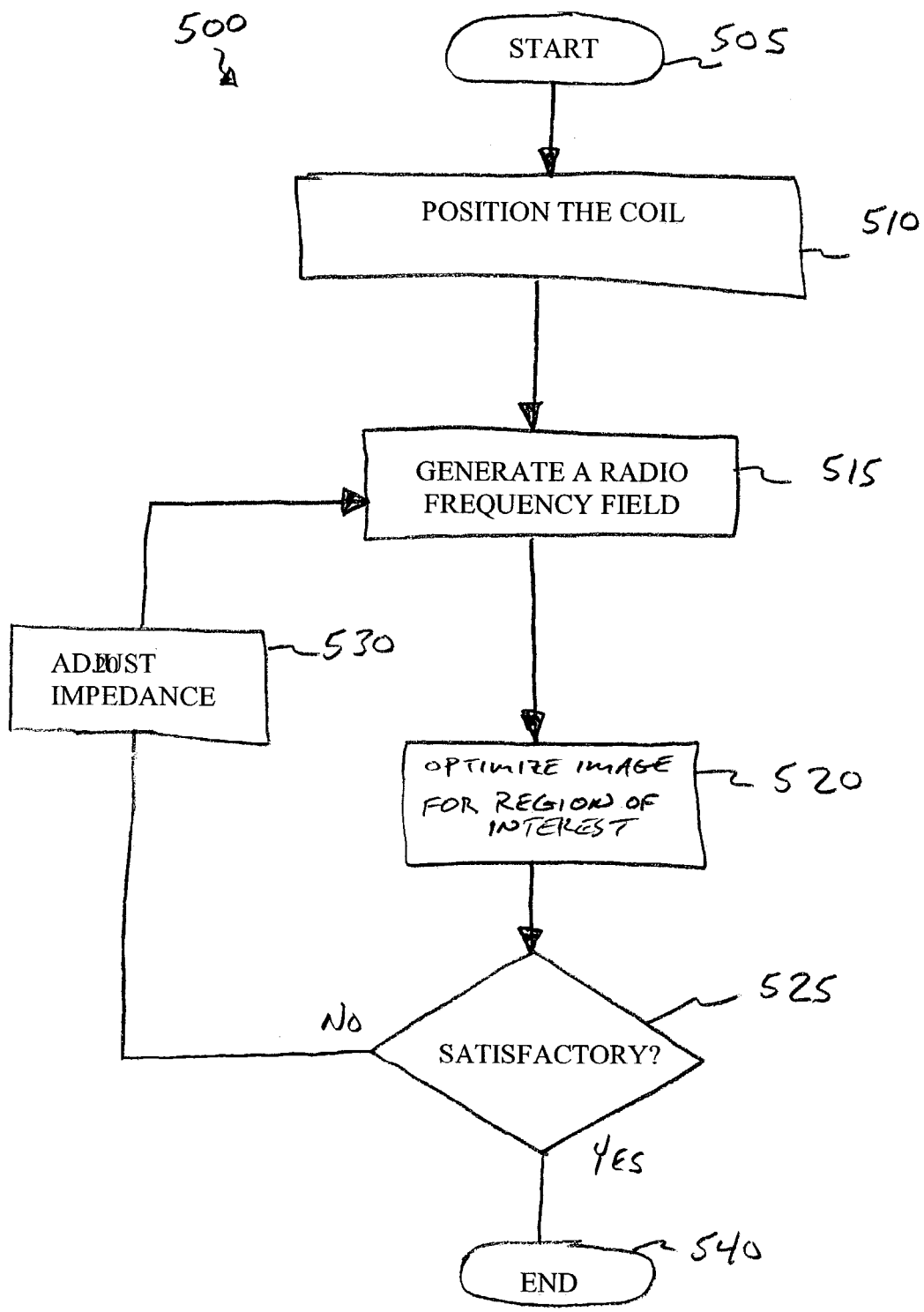
FIG. 5 includes a flow chart of a method according to one embodiment of the present subject matter.

FIG. 5 illustrates a flow chart of method 500 according to one embodiment of the present subject matter. The method starts at 505 and proceeds to 510 where the coil is positioned about a patient or other nuclear magnetic resonance active sample. In one embodiment, the coil is placed to generate a field at the region of interest. In one embodiment, this entails positioning coil 20A within magnet 10, as illustrated in FIG. 1, and placing a body or specimen within the volume. In one embodiment, a body coil according to the present subject matter is built into a bore of a magnet. At 515, a radio frequency field is generated within the volume. The driving signal for the radio frequency field is provided by transmitter 50 of FIG. 1 and connected to coil 20A by switch 25 in response to a signal on line 45 from console 60. The transmitter signal, in one embodiment, is divided in a power splitter to feed multiple current elements. At 520, the image uniformity or other desired parameter within the volume, or at the region of interest, is measured. In one embodiment, the parameter includes a particular measure of field homogeneity. In one embodiment, the parameter is selected to optimize imaging at the region of interest. At 525, an inquiry is presented to determine if the measured parameter is satisfactory. If not satisfactory, then the procedure continues at 530 wherein the coil is adjusted. Coil adjustment can be performed, for example, by changing an inductance value, a capacitance value or a resistance value or other the value of other components or circuit functions for one or more current elements of the coil. An impedance adjustment will result in a change of amplitude, phase or frequency of the current flowing in the coil. Following adjustment of the coil (for example, adjusting the impedance) at 530, processing continues at 515 where the radio frequency field is again generated. If the field or other measurement criteria are met following the inquiry at 525, then the method ends at 540. In one embodiment, the measurement criteria may entail determining if the field is sufficiently homogenous. The foregoing procedure is a description of negative feedback.

By way of example, in a 4 tesla (T) magnet, when imaging the heart, a radio frequency field dependant signal artifact may obscure the image. According to the present subject matter, the radio frequency field generated by the coil is manipulated to remove the artifact and improve the heart image uniformity. The independently controllable current elements are adjusted to compensate for radio frequency field inhomogeneities created by radio frequency wave propagation and loss phenomena in the anatomy. In one embodiment, the radio frequency field (sometimes referred to as the $B_1$ field) is produced by the coil at the Larmour frequency. Radio frequency shimming, in the manner described herein, is used to adjust, manipulate, or steer the radio frequency field to approximately optimize the field for a nuclear magnetic resonance measurement at a region of interest.

In one embodiment, the present subject matter is used to produce a desired radio frequency field gradient. The radio frequency field gradient, in one embodiment, allows for selective excitation of the imaging volume, as illustrated, for example, by method 600 of FIG. 6. In the figure, the procedure begins at 605 and proceeds to 610 where the coil is positioned at a region of interest. The region of interest may include a portion of a human body or other specimen to be imaged. At 615, a slice or volume is selected for signal acquisition. The slice, in one embodiment, includes a three dimensional volume in the region of interest. At 620, an impedance or other property of one or more current elements is adjusted to select a particular slice or volume in the object. At 625, the data is acquired for the selected slice or volume. The method ends at 630.

The amplitude and phase of the field gradient can be changed during an imaging scan by a variety of signal acquisition protocols. Gradient selection, in the manner described herein, can be used to improve the $B_1$ field over each slice or volume element in a multiple slice scan.

In one embodiment, the impedance of a current element is adjusted by changing an impedance. The impedance can be changed, for example, by adjusting a dielectric in the core of an inductor or by changing the spacing of windings or by other means of changing the inductance. In one embodiment, the capacitance of a current element is adjusted by changing a capacitor. The impedance can be changed by adjusting a dielectric between plates of the capacitor or by changing the spacing on the plates or by other means of changing the capacitance. In one embodiment, the impedance is changed by physically adjusting a core or dielectric element.

Figure 6:
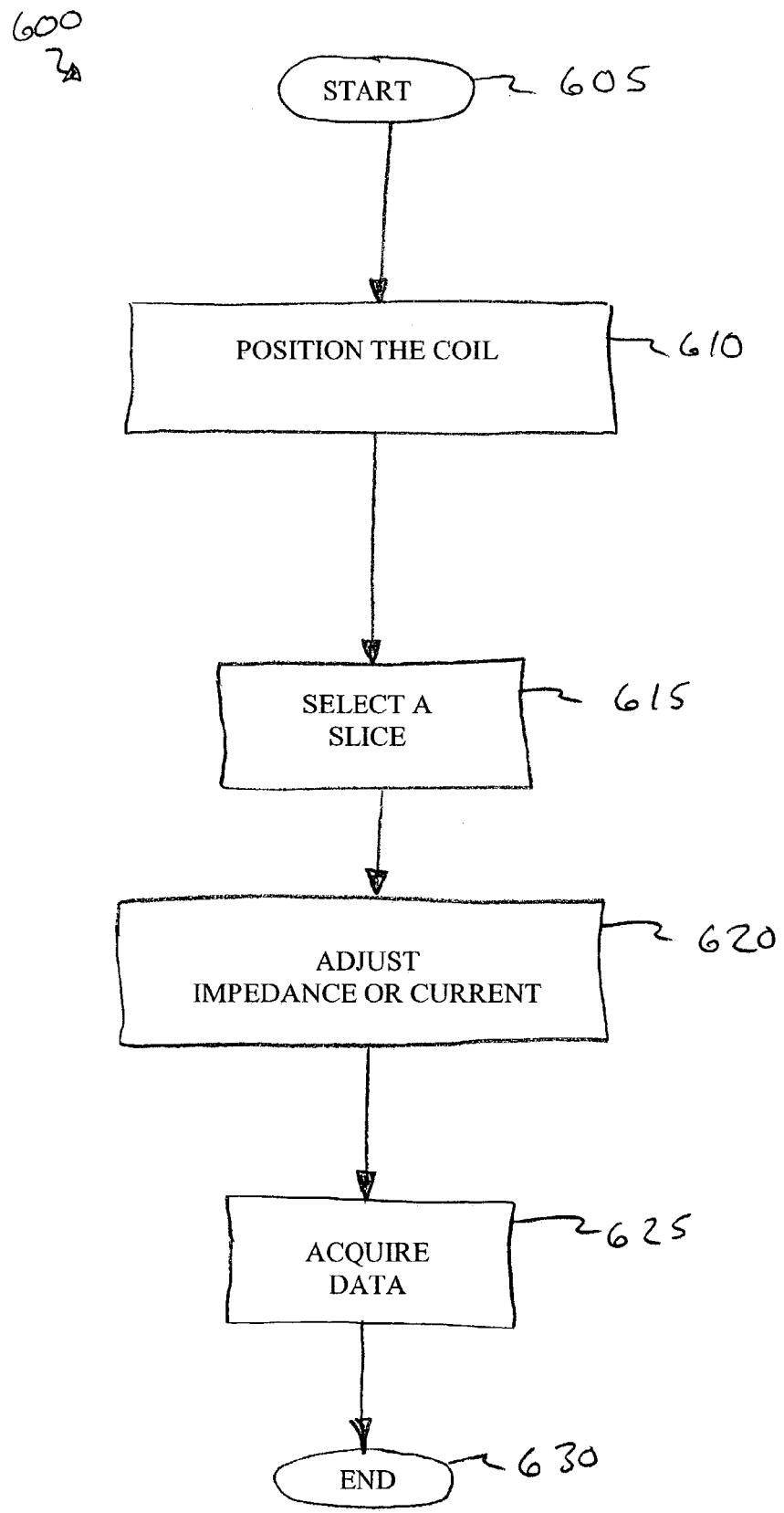
FIG. 6 includes a flow chart of a method according to one embodiment of the present subject matter.

In one embodiment, control of the procedures shown in FIG. 5 and FIG. 6 are executed by a console, a processor or other circuitry adapted to execute a procedure. For example, in one embodiment, console 60 in FIG. 1 includes a processor executing programming to adjust an impedance or select a region of interest for imaging.

The impedance of each current element of the present subject matter is independently adjustable. For example, in one embodiment, the impedance of a first current element can be increased while that of a second current element can be reduced without regard for the impedance of the first current element. In one embodiment, the impedance of multiple current elements in a group are adjusted as a unit. For example, in one embodiment, a threaded shaft is rotated to move a core within an inductor for a number of current elements, thereby changing the dielectric constant and thus, the impedance. Individual current elements can be adjusted independently to achieve a particular value or parameter and yet, as a whole a group of current elements can be adjusted to achieve a particular strategy.

The radio frequency field within the volume of a coil according to the present subject matter is dependent, in part, on the electrical properties of the anatomy or other sample to be imaged. For example, in a magnetic field of 7 T, the wavelength in air is approximately one meter (m) whereas the wavelength in human brain tissue is approximately 12 centimeters (cm). Thus, upon introduction of a human head into the volume of the coil, the radio frequency magnetic field within the head load is distorted by the electrical properties of the head. These anatomy, or load dependent distortions will often result in a non-uniform image. To create a more homogenous, or uniform image in such a coil, the impedance of one or more current elements can be independently adjusted to compensate for load dependent $B_1$ field distortions. The current elements can be adjusted individually or as part of a group of current elements.

Alternative Embodiments

Variations of the above embodiments are also contemplated. For example, in one embodiment, the present subject matter is adapted for use with imaging systems, such as, for example, spectroscopy systems, magnetic resonance imaging systems, nuclear magnetic resonance imaging systems, functional magnetic resonance imaging systems, and electron spin resonance systems. In one embodiment, the present subject matter is adapted for used with a technology utilizing a radio frequency coil.

In various embodiments, the present subject matter includes a solenoidal coil, a planar (surface) coil, a half-volume coil, a volume coil, a quadrature coil or a phased array coil, each of which include one or more current elements as described herein. For example, a surface coil, in one embodiment, includes a plurality of parallel current elements in adjacent alignment.

In one embodiment, a first radio frequency coil is used to transmit an excitation signal and a second radio frequency coil is used to receive a signal from the object or specimen under investigation.

In one embodiment, the present subject matter is adapted for parallel imaging. In parallel imaging, a plurality of one or more independent current elements are used to receive a signal. The signals received by each current element are combined through post processing to form a composite image. In one embodiment, a processor or console receives the plurality of signals and compiles the image. In one embodiment, an excitation signal is provided by one or more current elements and each current element is reactively decoupled from an adjacent current element.

In one embodiment, the present subject matter includes programming to cause an imaging system to perform shimming or gradient selection. The programming is adapted to run on a processor or console connected to a radio frequency coil. The programming may include instructions for operation by the processor or console.

In one embodiment, the impedance or other coil control component are manually adjustable. In one embodiment, the present subject matter includes a computer-accessible or machine-accessible storage medium with instructions and data to execute a method described herein.

In one embodiment, the present subject matter includes a plurality of current elements as described herein. In various embodiments, the current elements include wave guides, cavities, transmission line segments, microstrip segments or coaxial line segments.

In one embodiment, the present subject matter is used for interactive image optimization or negative feedback optimization.

In one embodiment of the present subject matter, one current element is electromagnetically decoupled from an adjacent current element. While, in some embodiments, a measurable amount of coupling may exist between adjacent current elements, nevertheless, it is understood that adjacent current elements are adequately decoupled for certain purposes, such as, for example, performing parallel imaging.

Decoupling, in one embodiment, includes physically separating adjacent current elements by a distance sufficient to reduce electromagnetic coupling. By introducing adequate physical separation, the field from one current element will have a de minimis effect on the field of an adjacent current element. Electronic circuitry can also be used to decouple current elements. For example, in one embodiment, a suitably sized capacitor or inductor provides substantial decoupling of adjacent current elements.

In one embodiment, each current element may be described as a discrete resonant current element in that elements do not rely on current flowing in an end-ring for proper operation. The current path in a current element is substantially confined to the inner and outer conductors and current significant to the operation of the coil does not flow in an end-ring structure. However, in one embodiment, an end ring is provided.

In one embodiment, a parameter associated with a radio frequency field is measured to gauge performance of the coil. Parameters may be measured in-situ or in conjunction with the development of a magnetic resonance image or nuclear magnetic resonance spectra. In one embodiment, the parameter is determined interactively in an iterative process of measuring and adjusting an adjustable component of a current element of the coil. For example, in one embodiment, the parameter includes field homogeneity. In one embodiment, the parameter includes signal intensity. For nuclear magnetic resonance, the signal amplitude of images or spectra is used as parameter. In one embodiment, the parameter includes determining how much power is needed to achieve a predetermined intensity in a region. In one embodiment, the parameter includes signal to noise ratio. Other parameters include the field of view, relaxation constants (such as T1 and T2), echo time (TE) and repetition time (TR).

In one embodiment, a phase shifter is used to adjust the current phase in individual current elements. A phase shifter, in various embodiments, includes a delay element, capacitor or a PIN diode circuit.

In various embodiments, radio frequency transmit signal amplitude is controlled by the power amplifier gain. Receiver signal amplitude, in one embodiment, is controlled by the gain of a preamplifier.

In various embodiments, the frequency of a radio frequency signal is controlled by an inductor or capacitor. In one embodiment, capacitance can be provided by a discrete capacitor or distributed capacitance. In one embodiment, inductance can be provided by a discrete inductor or distributed inductance.

For purposes of shimming, according to one embodiment, a component of a current element is adjusted to establish a desired radio frequency field within the coil. The field can be manipulated to provide a suitable bias to compensate for body-caused artifacts. During the study, the bias is maintained.

For purposes of gradient selection, according to one embodiment, the bias is switched to progress across a region of interest over a period of time. By sweeping the bias across the region of interest, individual slices or volumes can be selected at different times.

For purposes of parallel imaging, according to one embodiment, the current elements are electromagnetically decoupled. Transmitting using such a coil, in one embodiment, includes driving each current element directly from a single transmitter signal divided and distributed to the elements by means of a power splitter rather than relying on inductive coupling for signal propagation. In one embodiment, multiple power amplifiers are dedicated to respective current elements in the coil.

In one embodiment, the present subject matter includes a plurality of discrete resonant current elements each disposed about a region of interest. Each current element includes pair of parallel conductors that are separated by a dielectric. Each current element includes an adjustable component.

In various embodiments, the adjustable component includes a capacitance, an inductance, a voractor, a PIN diode, or a phase shifter. In one embodiment, a preamplifier (or receiver) is connected to a current element. In one embodiment, a transmitter is connected to a current element. In one embodiment, a radio frequency filter circuit is connected to a current element. In one embodiment, a transmit-receive switch is connected to the first current element. In one embodiment, a combiner is connected to two or more current elements. In one embodiment, a power splitter is connected to two or more current elements. In one embodiment, a component control line connected to the first current element and is adapted to control the adjustable component. The component control line, in various embodiments, includes a direct current or alternating current control signal. In one embodiment, a pair of current elements are electromagnetically decoupled.

In one embodiment, a system includes a radio frequency coil and a console connected to an adjustable component of a current element of the coil. The console is adapted to control the adjustable component.

In one embodiment, the current element is connected to the console by a transmitter. In one embodiment, the current element is connected to the console by a receiver. In one embodiment, the current element is connected to the console by a control line that is connected to the adjustable component. In one embodiment, the console includes programming to provide radio frequency field shimming. In one embodiment, the console includes programming to select a radio frequency field gradient. In one embodiment, the console includes programming to provide parallel signal excitation. In one embodiment, the console includes programming to provide parallel signal reception. Parallel signal excitation and reception are used with parallel imaging.

In one embodiment, a method according to the present subject matter includes positioning a sample relative to a radio frequency coil. In one embodiment, this entails placing the sample adjacent the coil. In one embodiment, this entails placing the sample within a volume of the coil. The method includes comparing a parameter with a predetermined value. The measured parameter includes a radio frequency field dependant parameter associated with nuclear magnetic resonance. If the measured nuclear magnetic resonance parameter is unsatisfactory, then the method entails adjusting the adjustable component to achieve a satisfactory nuclear magnetic resonance value.

In various embodiments, the method includes adjusting an impedance, a capacitance, an inductance, a PIN diode or adjusting a phase. In one embodiment, the method includes adjusting a preamplifier connected to a current element. In one embodiment, the method includes adjusting a transmitter connected to a current element. In various embodiments, the method includes adjusting a radio frequency filter circuit, a transmit-receive switch, or a component control line connected to a current element In one embodiment, a method according to the present subject matter includes positioning a sample relative to a radio frequency coil having a first current element and a second current element. The method includes adjusting adjustable components of the first current element the second current element to achieve a satisfactory nuclear magnetic resonance value and processing a signals received from the two current elements using a parallel imaging routine. In one embodiment, the method includes an article having a machine-accessible storage medium including stored data, wherein the data, when accessed, results in a machine performing a method. The method includes determining a parameter of a field in a region of interest proximate a radio frequency coil and adjusting an impedance of a first current element at a time when an impedance of a second current element remains fixed. The impedances are adjusted such that the impedances cause the parameter to be satisfied. In one embodiment, the parameter includes determining image uniformity. In one embodiment, the second impedance is adjusted without affecting the first impedance. In one embodiment, a reactive component is adjusted.

CONCLUSION

The above description is intended to be illustrative, and not restrictive. Many other embodiments will be apparent to those of skill in the art upon reviewing the above description.

What is claimed is:

1. A radio frequency coil comprising:
a plurality of discrete resonant current elements disposed about a region of interest, each current element having a pair of parallel conductors separated by a dielectric and having an adjustable component, the adjustable component having a control line, and the plurality of current elements including at least a first current element, and wherein a current in the current element is determined by the adjustable component and wherein a value of the adjustable component is determined by a signal on the control line.

2. The radio frequency coil of claim 1 wherein the adjustable component includes a capacitance.

3. The radio frequency coil of claim 1 wherein the adjustable component includes an inductance.

4. The radio frequency coil of claim 1 wherein the adjustable component includes a voractor.

5. The radio frequency coil of claim 1 wherein the adjustable component includes a PIN diode.

6. The radio frequency coil of claim 1 wherein the adjustable component includes a phase shifter.

7. The radio frequency coil of claim 1 further including a preamplifier connected to the first current element.

8. The radio frequency coil of claim 1 further including a transmitter connected to the first current element.

9. The radio frequency coil of claim 1 further including a radio frequency filter circuit connected to the first current element.

10. The radio frequency coil of claim 1 further including a transmit-receive switch connected to the first current element.

11. The radio frequency coil of claim 1 further including a power splitter connected to the first current element.

12. The radio frequency coil of claim 1 further including a power combiner connected to the first current element.

13. The radio frequency coil of claim 1 wherein the plurality of current elements further includes a second current element and wherein the first current element is electromagnetically decoupled from the second current element.

14. The radio frequency coil of claim 1 wherein the adjustable component of the first current element controls a phase in the first current element.

15. The radio frequency coil of claim 1 wherein the adjustable component of the first current clement controls a frequency in the first current element.

16. The radio frequency coil of claim 1 wherein the adjustable component of the first current element controls an amplitude in the first current element.

17. A system comprising:
a radio frequency coil having a plurality of discrete resonant current elements about a region of interest, each current element having a pair of parallel conductors separated by a dielectric and having an adjustable component, the adjustable component having a control line, and wherein a current in the current element is determined by the adjustable component, the plurality of current elements including at least a first current element and a second current element; and
a console connected to an adjustable component and adapted to control a value of the adjustable component based on a signal on the control line.

18. The system of claim 17 wherein a frequency of the current is determined by the adjustable component.

19. The system of claim 17 wherein an amplitude of the current is determined by the adjustable component.

20. The system of claim 17 wherein a phase of the current is determined by the adjustable component.

21. The system of claim 17 wherein the first current element is connected to the console by a transmitter.

22. The system of claim 17 wherein the first current element is connected to the console by a receiver.

23. The system of claim 17 wherein the console is adapted to provide radio frequency field shimming.

24. The system of claim 17 wherein the console is adapted to provide a radio frequency field gradient.

25. The system of claim 17 wherein the console is adapted to provide parallel signal excitation.

26. The system of claim 20 wherein the console is adapted to provide parallel signal reception.

27. The system of claim 17 wherein the console includes a processor and the adjustable component includes a reactive component.

28. A radio frequency coil comprising:
a plurality of discrete resonant current elements disposed about a region of interest, each current element having a pair of parallel conductors separated by a dielectric and having an adjustable component including a PIN diode, the adjustable component having a control line, and the plurality of current elements including at least a first current element, and wherein a current in the current element is determined by the adjustable component and wherein a value of the adjustable component is determined by a signal on the control line.

29. A radio frequency coil comprising:
a plurality of discrete resonant current elements disposed about a region of interest, each current element having a pair of parallel conductors separated by a dielectric and having an adjustable component including a voractor, the adjustable component having a control line, and the plurality of current elements including at least a first current element, and wherein a current in the current element is determined by the adjustable component and wherein a value of the adjustable component is determined by a signal on the control line.

30. A system comprising:
a radio frequency coil having a plurality of discrete resonant current elements about a region of interest, each current element having a pair of parallel conductors separated by a dielectric and having an adjustable component, the adjustable component having a control line, and wherein a current in the current element is determined by the adjustable component, the plurality of current elements including at least a first current element and a second current element;
an RF transmission line connecting at least one of the plurality of discrete current elements to a transmit-receive switch; and
a console connected to an adjustable component and adapted to control a value of the adjustable component based on a signal on the control line.

* * * * *

UNITED STATES PATENT AND TRADEMARK OFFICE
CERTIFICATE OF CORRECTION

PATENT NO. : 7,598,739 B2
APPLICATION NO. : 10/420541
DATED : October 6, 2009
INVENTOR(S) : J. Thomas Vaughan et al.

It is certified that error appears in the above-identified patent and that said Letters Patent is hereby corrected as shown below:

In the Specifications:

In Column 1, Lines 17 to 22 delete the following:

"GOVERNMENT RIGHTS

The present subject matter was partially supported by the National Institute of Health (NIH) under Agency Grant Numbers NIH ROI-CA76535 and P41 RR08079. The United States government may have certain rights in the invention."

and insert the following

--This invention was made with government support under R01-CA076535 and P41-RR008079 awarded by the National Institutes of Health. The government has certain rights in the invention.--

Signed and Sealed this
Twenty-third Day of April, 2013

Teresa Stanek Rea
*Acting Director of the United States Patent and Trademark Office*